(12) United States Patent
Clarke et al.

(10) Patent No.: US 7,065,466 B2
(45) Date of Patent: Jun. 20, 2006

(54) ATTENUATOR TEST SYSTEM

(75) Inventors: Jeffrey R. Clarke, Lake Ronkonkoma, NY (US); Robert M. Buckley, Medford, NY (US); Dean R. Silhan, Massapequa, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 0 days.

(21) Appl. No.: 10/767,038

(22) Filed: Jan. 29, 2004

(65) Prior Publication Data

US 2005/0171716 A1    Aug. 4, 2005

(51) Int. Cl.
*G06F 19/00* (2006.01)

(52) U.S. Cl. .................. 702/122; 702/66; 702/116; 702/122; 324/601; 324/638; 370/288

(58) Field of Classification Search .................. 702/66, 702/116, 122, 124, 182, 189; 324/601, 638; 370/288
See application file for complete search history.

(56) References Cited

U.S. PATENT DOCUMENTS

| | | | | |
|---|---|---|---|---|
| 4,050,055 | A | * | 9/1977 | DiLeo .................. 367/87 |
| 4,625,332 | A | * | 11/1986 | Singer et al. ............ 455/67.14 |
| 5,457,463 | A | * | 10/1995 | Vencel et al. ............... 342/169 |
| 5,524,281 | A | * | 6/1996 | Bradley et al. .......... 455/67.15 |
| 5,784,275 | A | | 7/1998 | Sojoodi |
| 5,861,882 | A | | 1/1999 | Sprenger |
| 6,091,247 | A | | 7/2000 | Liu |
| 6,311,149 | B1 | | 10/2001 | Ryan |
| 6,418,391 | B1 | | 7/2002 | Umezu |
| 6,529,844 | B1 | * | 3/2003 | Kapetanic et al. ........... 702/85 |
| 6,707,979 | B1 | * | 3/2004 | Wang et al. ................ 385/140 |
| 2002/0109734 | A1 | | 8/2002 | Umezu |

OTHER PUBLICATIONS

Warner, 'High Accuracy, 150 dB, Attenuation Measurement System for Traceability at Radio Frequency'.*
Kilby et al., 'The Accurate Measurement of High Attenuation at Radio Frequencies', Apirl 1995, IEEE Article, vol.: 44, No. 2, pp. 308-311.*
TEGAM Model VM-7 Attenuator & Signal Calibrator (30MHz Receiver) 2003.

(Continued)

*Primary Examiner*—Marc S. Hoff
*Assistant Examiner*—Elias Desta
(74) *Attorney, Agent, or Firm*—Brian Roffe

(57) ABSTRACT

System for testing attenuators by a flatness and standing wave ratio tests which includes a vector network analyzer (VNA) adapted to be coupled to a device under test (DUT) and which provides an input stimulus signal for the DUT and, when certain conditions are satisfied, receives an output signal from the DUT, and a calibration receiver adapted to be coupled to the DUT via a down-converter. When certain conditions are satisfied, the output signal from the DUT is sent to the calibration receiver (through the down-converter to be possibly modified thereby depending on the testing frequency). A signal generator provides a local oscillator (LO) signal for the down-converter. A control unit is connected to the instruments and embodies software which analyzes the testing conditions, i.e., the attenuator value being tested, and selects whether the network analyzer or the calibration receiver will measure the output signal from the DUT.

19 Claims, 11 Drawing Sheets

OTHER PUBLICATIONS

TEGAM Model 8850-18: 10 MHz-18 GHz Precision RF Attenuation Measurement & Calibration 2003.

TEGAM Model 8850-40: 10 MHz-40 GHz Precision RF Attenuation Measurement & Calibration System 2003.

* cited by examiner

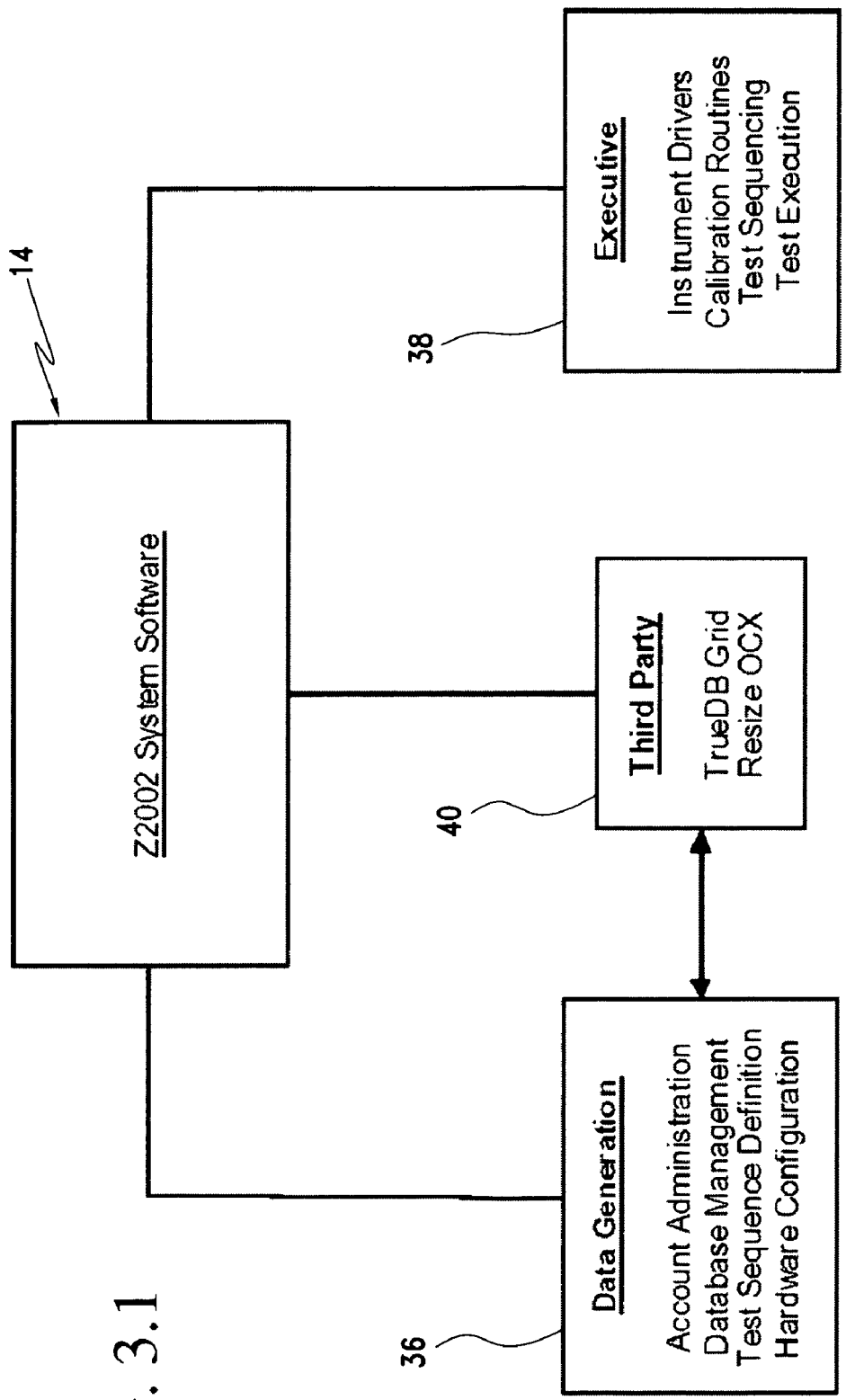
FIG. 3.1

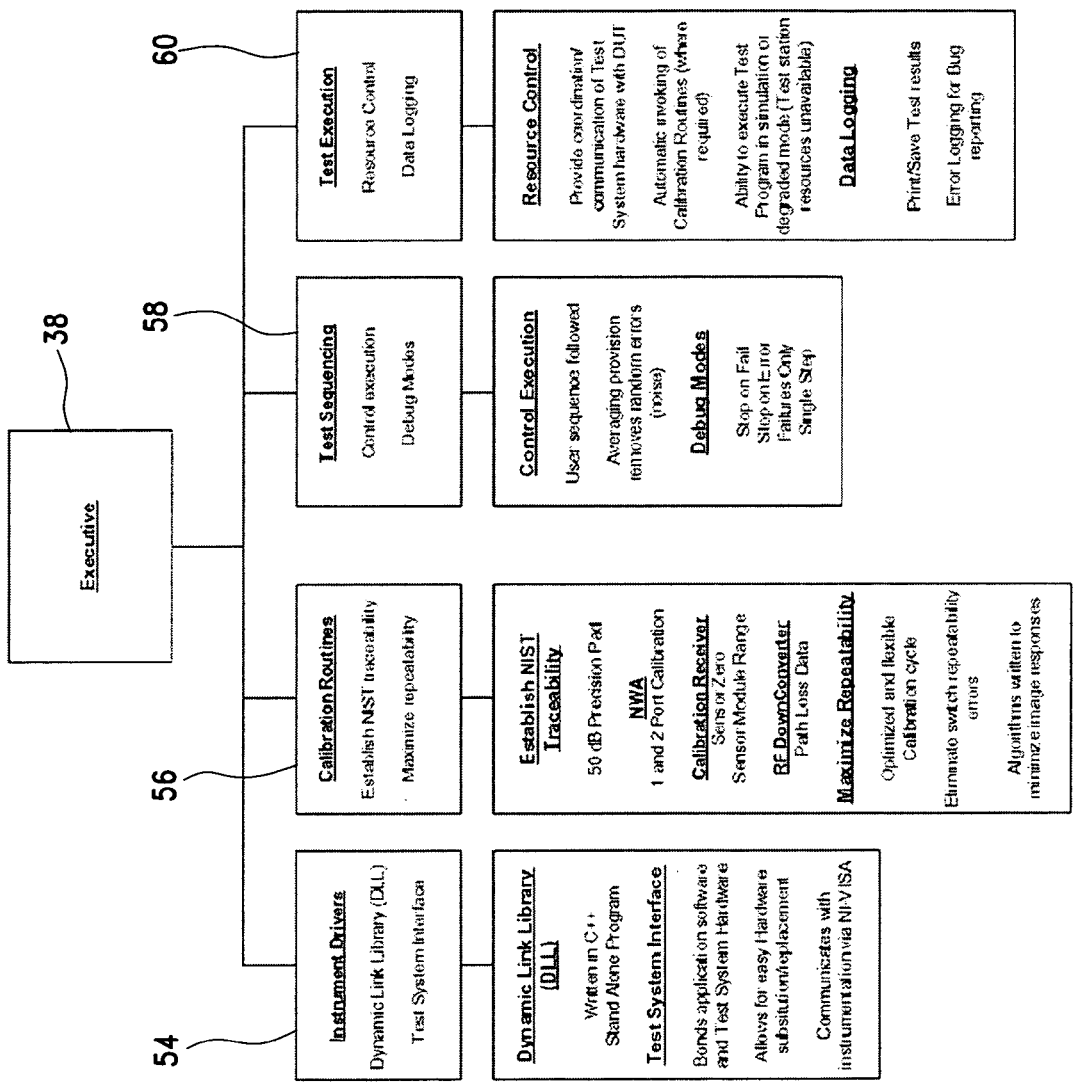
FIG. 3.2

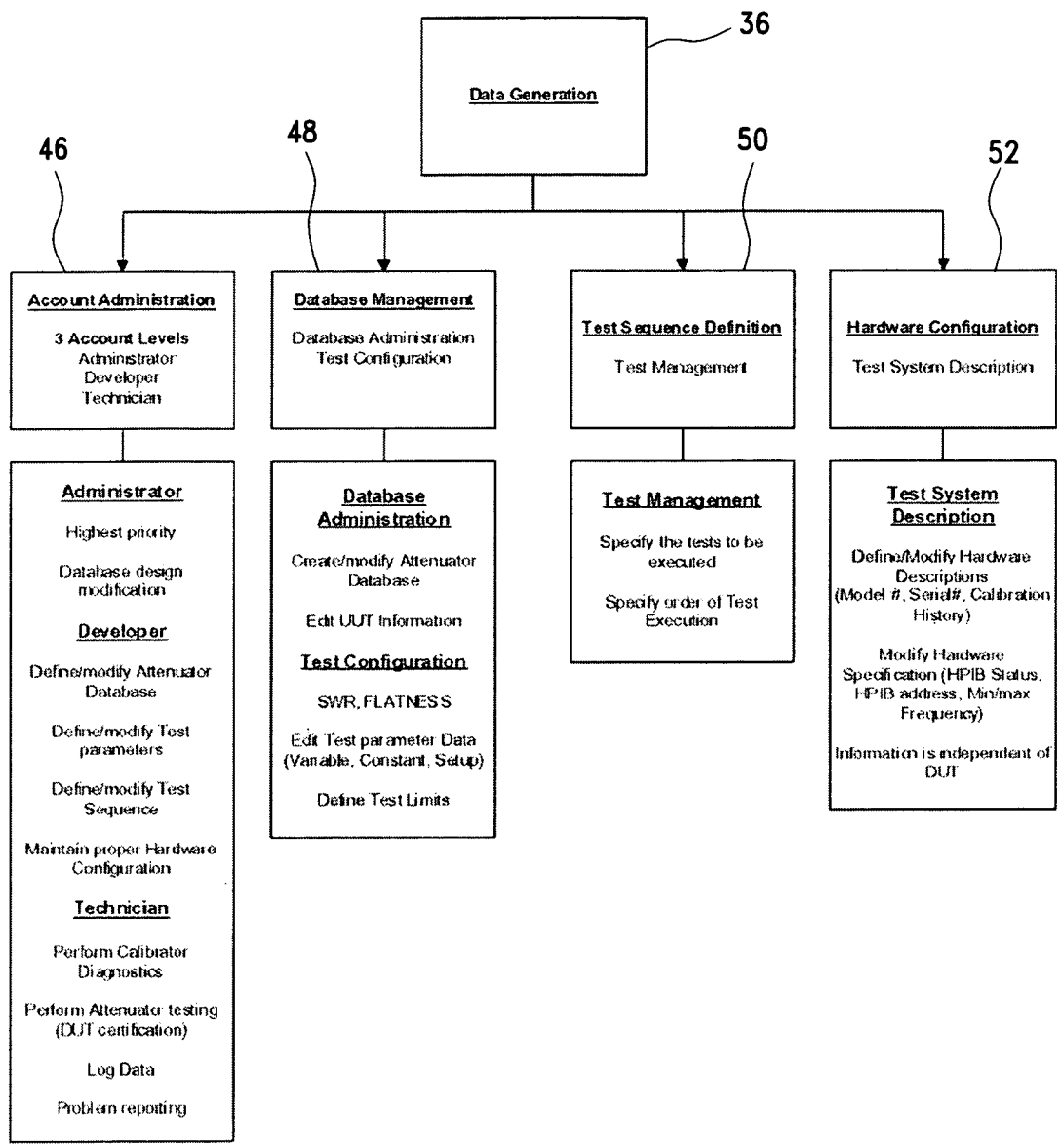
FIG. 3.3

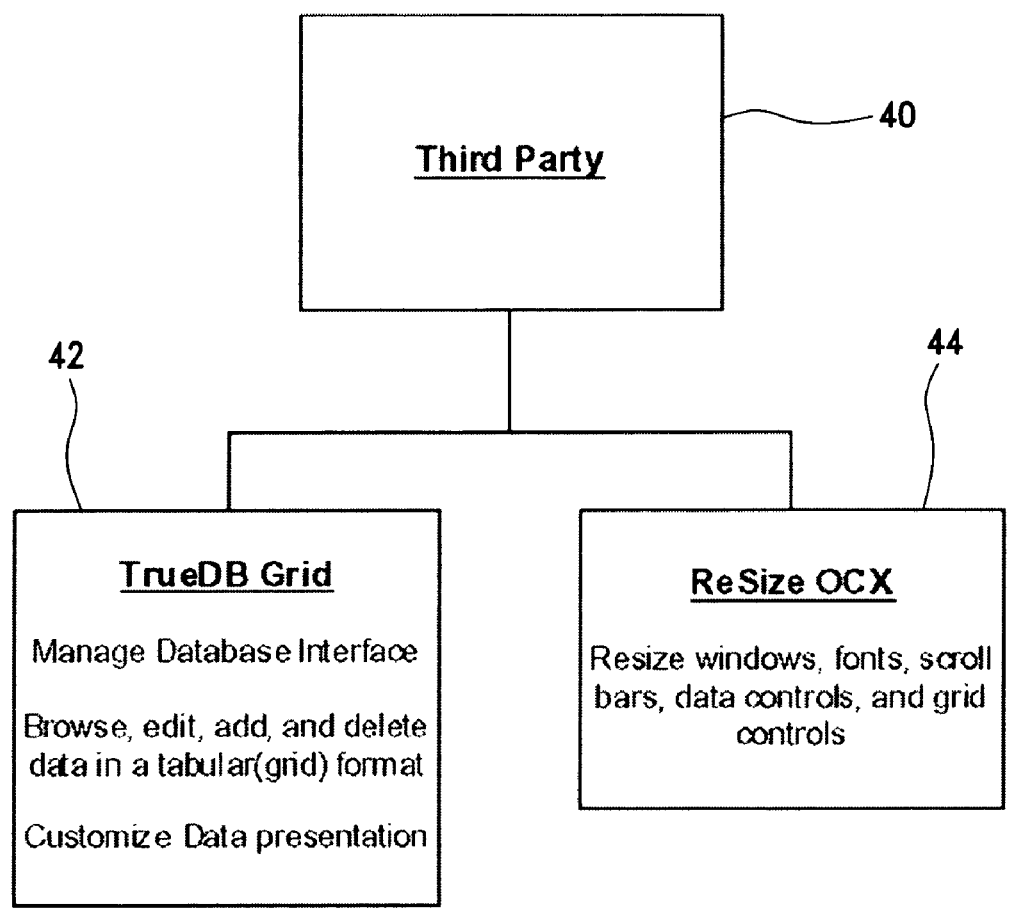
FIG. 3.4

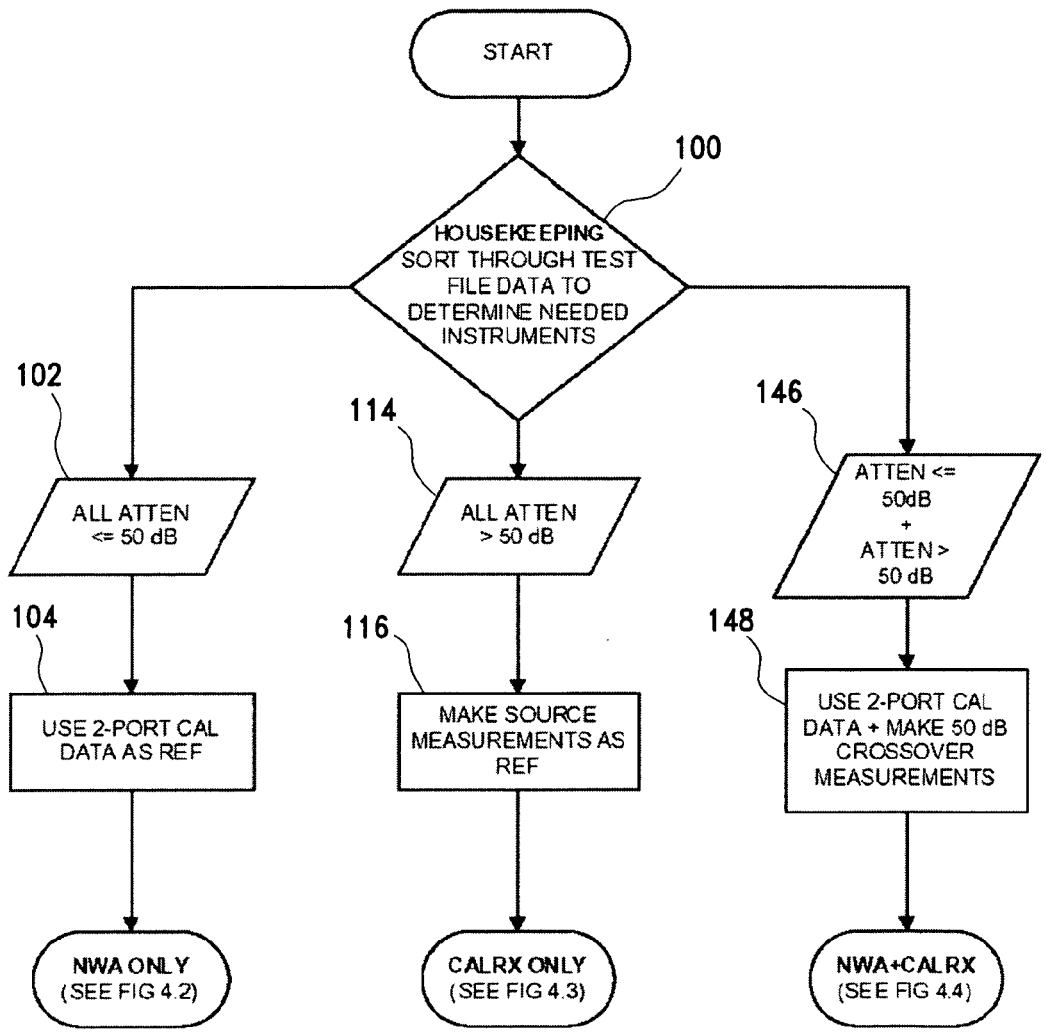
FIG. 4.1

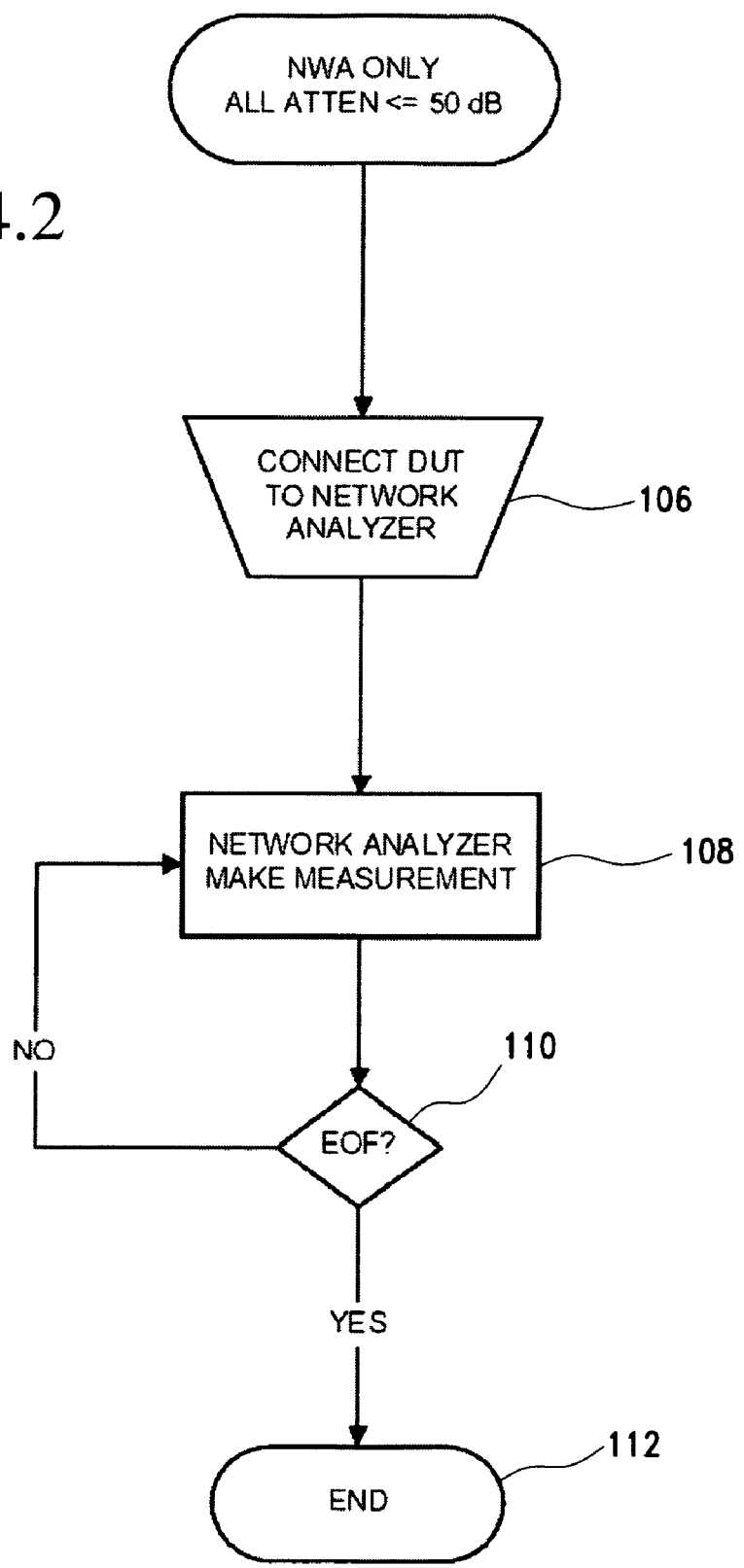
FIG. 4.2

FIG. 4.3
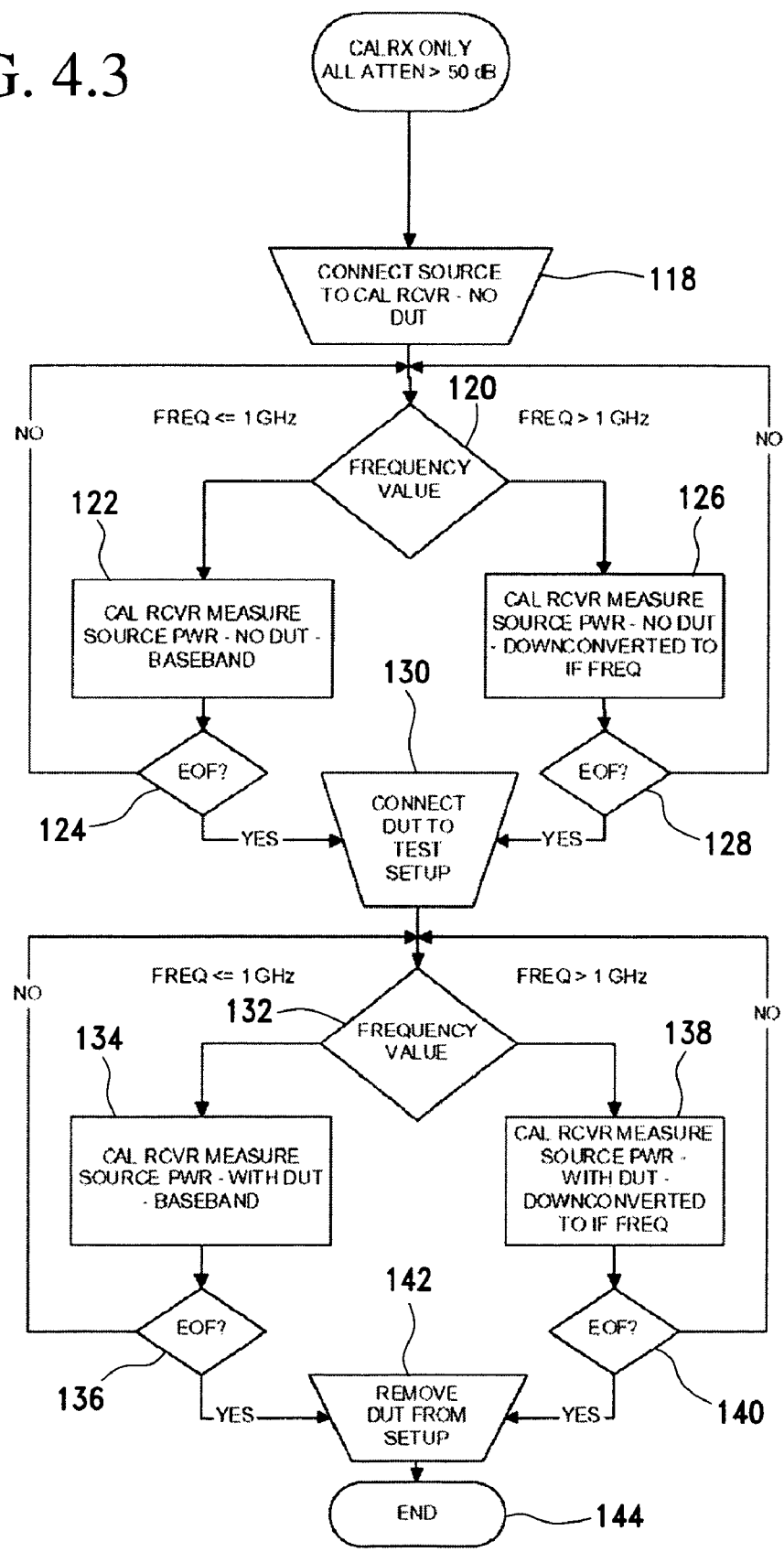

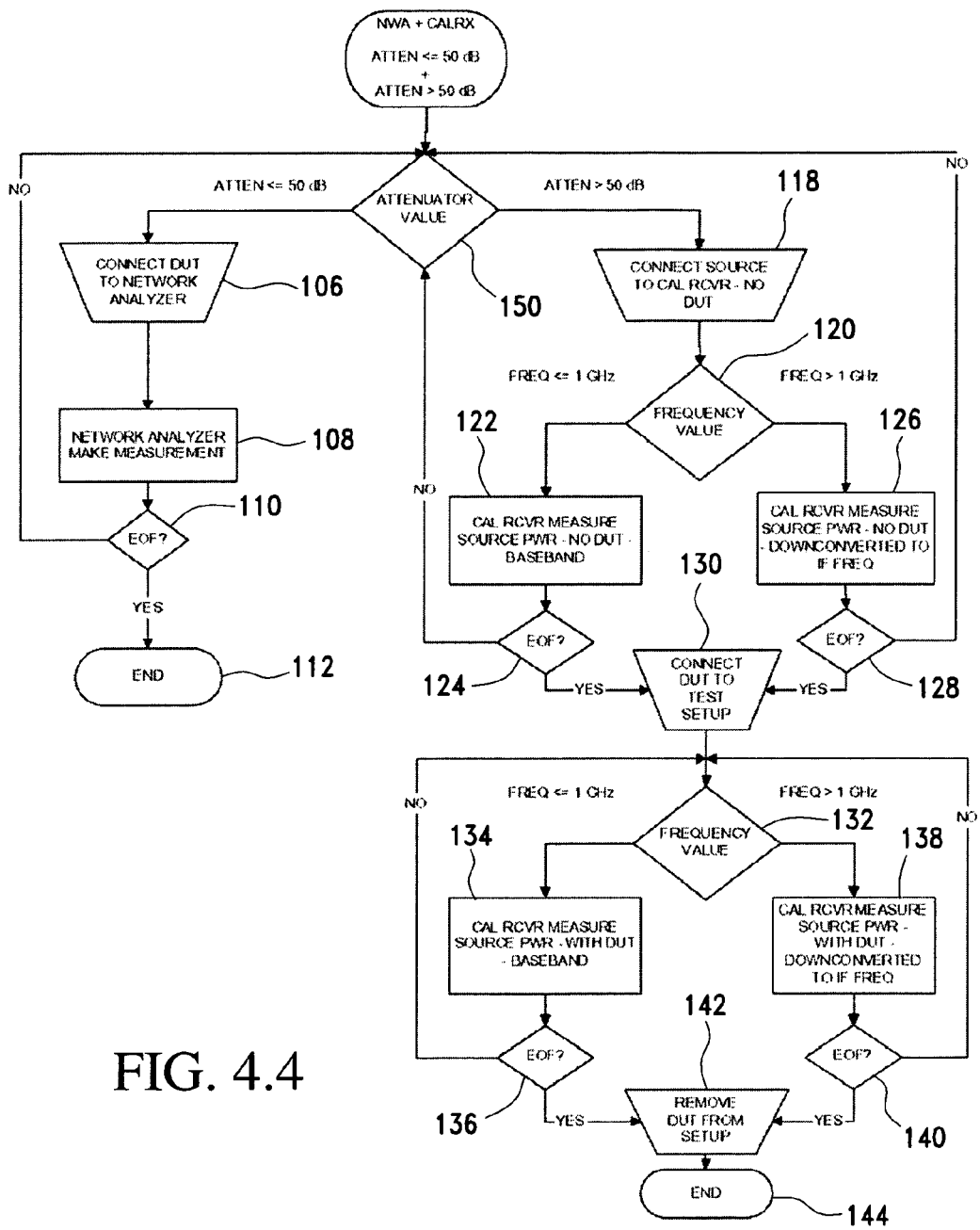
FIG. 4.4

ATTENUATOR TEST SYSTEM

FIELD OF THE INVENTION

The present invention relates generally to an automated system for testing attenuators and more specifically to a wide frequency, high dynamic range, database driven, automated system for testing attenuators. Briefly, the automated system may be used to test fixed and programmable attenuators with precise results that are repeatable and traceable to NBS (National Bureau of Standards) standards. Precision testing of attenuators has applications throughout the field of electronic instrumentation testing and calibration.

BACKGROUND OF THE INVENTION

Although few in number, there are existing systems for testing attenuators, but they are usually very limited in capability, speed (throughput), repeatability, and traceability (for example to NBS standards). Common limitations of currently available attenuator testers include the following: limited frequency range of operation (band-limited), lack of dynamic range required to accurately measure large value attenuators (greater than about 80 dB), relatively slow and encumbered testing in view of the use of bridges for SWR (Standing Wave Ratio) testing, results lack measurement repeatability due to connector and switch repeatability (especially at higher frequency), and results lack traceability of accuracy to known standards.

OBJECTS AND SUMMARY OF THE INVENTION

It is an object of the present invention to provide new and improved systems for testing attenuators, also referred to herein as an attenuator tester or attenuator test system, and methods for using the same.

It is another object of the present invention to provide an attenuator test system which has an extremely wide frequency range of operation. One example of a wide frequency range would be a frequency band which starts at about 50 MHz and extends to about 40 GHz (with 40 GHz option).

It is yet another object of the present invention to provide an attenuator tester which has an extremely wide dynamic range for measurement of large value attenuators. This is particularly beneficial when measurements of attenuation above 80 dB, even to a level of 120 dB are required, because system limitations such as dynamic range and noise floor make it difficult is not impossible for most currently available attenuator test systems to perform this task (especially over a wide frequency range).

It is still another object of the present invention to provide an attenuator tester which utilizes multiple-range capability coupled with precision level transfer standards in order to expand the measurement dynamic range capability beyond current limitations.

Another object of the present invention to provide an attenuator tester which incorporates database-driven software and includes a minimal amount of test accessories in order to accelerate testing of the attenuators.

Still another object of the present invention is to provide an attenuator tester which is capable of producing repeatable test results.

It is another object of the present invention to provide an attenuator test system whose accuracy is traceable.

In order to achieve these objects and others, a system for testing attenuators in accordance with the invention includes a vector network analyzer (VNA) adapted to be coupled to a device under test (DUT) and which provides an input stimulus signal for the DUT and, when certain conditions are satisfied, receives an output signal from the DUT, and a calibration receiver adapted to be coupled to the DUT via a down-converter. When certain conditions are satisfied, the output signal from the DUT is sent to the calibration receiver (through the down-converter to be possibly modified thereby depending on the testing frequency). A signal generator provides a local oscillator (LO) signal for the down-converter. A control unit is connected over a bus to the various instruments and embodies software which, among other things, analyzes the testing conditions, i.e., the attenuator value being tested, and selects whether the network analyzer or the calibration receiver will measure the output signal from the DUT.

With respect to providing a wide frequency range of operation for the attenuator tester in accordance with the invention, it is possible to utilize a microwave down-converter (for example of a type provided by the current assignee), which would enable the system to make measurements at about 40 GHz as if they were made at about 100 MHz. The current assignee's microwave down-converter stores correction (loss) factors spanning the frequency range of operation. This data accounts for non-linearity and distortions in measurements that would otherwise reduce accuracy.

The down-converter would be operative whenever the measurement frequency, without modification, exceeds the capability of the calibration receiver. For example, the calibration receiver may measure frequencies only up to and including 1 GHz in which case, larger frequencies would be down-converted.

Regarding the dynamic measurement range of the attenuator tester in accordance with the invention, the invention has an extremely wide dynamic range for measurement of large value attenuators. While measuring 20 dB or 40 dB of attenuation is a simple task for common test instrumentation, when measurements of attenuation above 80 dB, even to a level of 120 dB are required, system limitations such as dynamic range and noise floor make it practically impossible for most currently available attenuator test systems to perform this task (especially over a wide frequency range). By utilizing multiple-range capability coupled with precision level transfer standards, the attenuator test system in accordance with the invention is capable of expanding the measurement dynamic range capability beyond limitations of currently available attenuator test systems.

Testing of attenuators by the attenuator test system in accordance with the invention is accelerated in view of the use of database-driven software and a minimization of test accessories. The database capability of the test software allows test files to be created quickly and easily. These test files are created once and then used indefinitely or edited and reused. The test equipment is also part of the database capability. The database capability of the software allows test system instrumentation to change and be easily adapted and reconfigured, thereby creating greater system flexibility. Testing may also be further accelerated through the minimization of test accessories, such as bridges used by most test systems for the performance of SWR testing. In a preferred embodiment, the attenuator test system in the invention utilizes a network analyzer for SWR testing, thereby eliminating the need for such accessories, and the test time required for the assembly of such accessories and disassembly within the test setup.

The attenuator test system provides the capability of both flatness and SWR testing. The purpose of attenuator flatness testing is to measure the variation in attenuation over the frequency range of operation or specification. In order to perform this testing, the system itself is designed to capable of providing both stimulus and measurement (response) capability over the specified frequency range. The purpose of SWR testing is to measure the amount of energy reflected by an attenuator at its connection interface.

An important advantage of the attenuator test system in accordance with the invention is its capability of producing repeatable test results. One of the most common sources of error within a test system, which destroys measurement repeatability, is switch repeatability. Each time a switch contact is made or broken, the degree of reliability is changed, and thus switch contact resistance functions as an unrepeatable variable over time. The attenuator test system in accordance with the invention minimizes the switch repeatability variable, optimally through the use of path data stored in a microwave down-converter (such as sold by the current assignee). The path data contains correction factors to account for changes in contact resistance along switched paths.

Another important advantage of the attenuator test system in accordance with the invention is that its accuracy is traceable. Utilizing 50 dB precision reference attenuators to establish range transfer functions, the accuracy of the attenuator test system's measurement system becomes traceable to known standards.

The software used in the attenuator test system in accordance with the invention is database driven in terms of test system instrumentation and test performance parameters. Information pertaining to the test instruments within the system configuration is stored within the database. Typical information includes but is not limited to model number, serial number, frequency range (maximum and minimum frequency). The instrumentation information is changed whenever a change in the system configuration is made. In this manner, the software enhances system flexibility to accommodate multiple configurations of test instrumentation. Likewise, the database approach allows maximum flexibility of test performance parameters. Test performance data is stored in test files, in table format, which includes parameters such as test frequency with corresponding upper and lower measurement limits. Test files are easily edited to adapt to new test requirements.

BRIEF DESCRIPTION OF THE DRAWINGS

The following drawings are illustrative of embodiments of the invention and are not meant to limit the scope of the invention as encompassed by the claims.

FIGS. 3.1–3.4 are software block diagrams of the attenuator test system in accordance with the invention.

FIGS. 4.1–4.4 are flowcharts of a test for flatness using the attenuator test system in accordance with the invention.

DETAILED DESCRIPTION OF THE PREFERRED EMBODIMENTS

Figure 1:
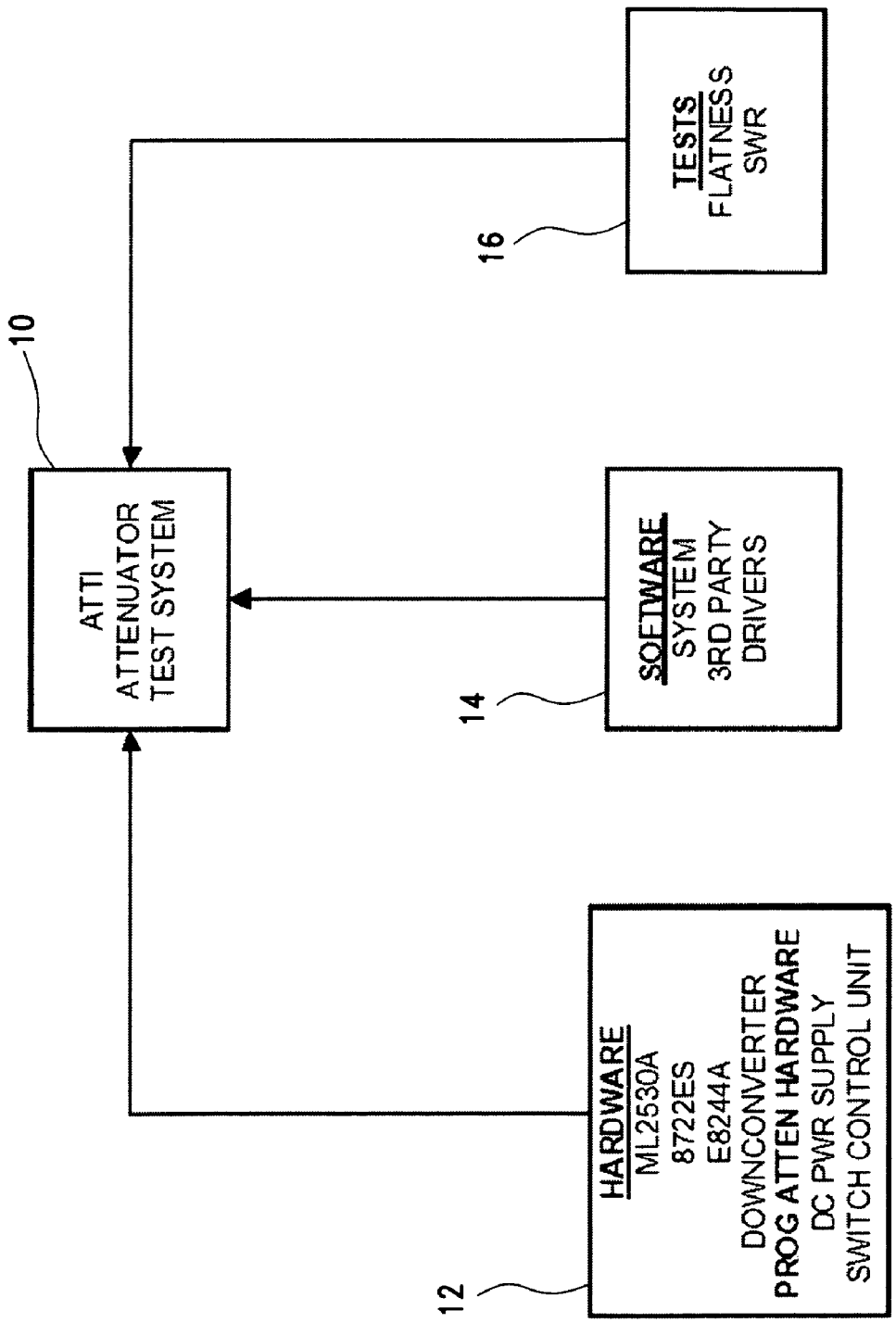
FIG. 1 is a plan of the attenuator test system in accordance with the invention.

Referring to the accompanying drawings wherein like reference numerals refer to the same or similar elements, FIG. 1 shows an outline of an attenuator test system in accordance with the invention. The attenuator test system is designated generally as 10 and includes a hardware portion 12 and a software portion 14. The software 14 controls the hardware 12 to perform specific tests 16. Although the tests 16 are in essence a part of the system software 14, they deserve distinction as a key component within the architecture of the attenuator test system 10 and will therefore be treated separately from the software 14. In particular, the attenuator tests 16 performed by the attenuator test system 10 include SWR and flatness tests.

The attenuator test system 10 is designed to be capable of testing both fixed and variable attenuators over a frequency range of about 50 MHz to about 40 GHz (with 40 GHz option). The attenuator test system 10 has a dynamic range of about 120 dB (minimum). As discussed in greater detail below, the software 14 provides a user-friendly interface, supported by a database environment that allows flexibility in system configuration and testing.

Figure 2:
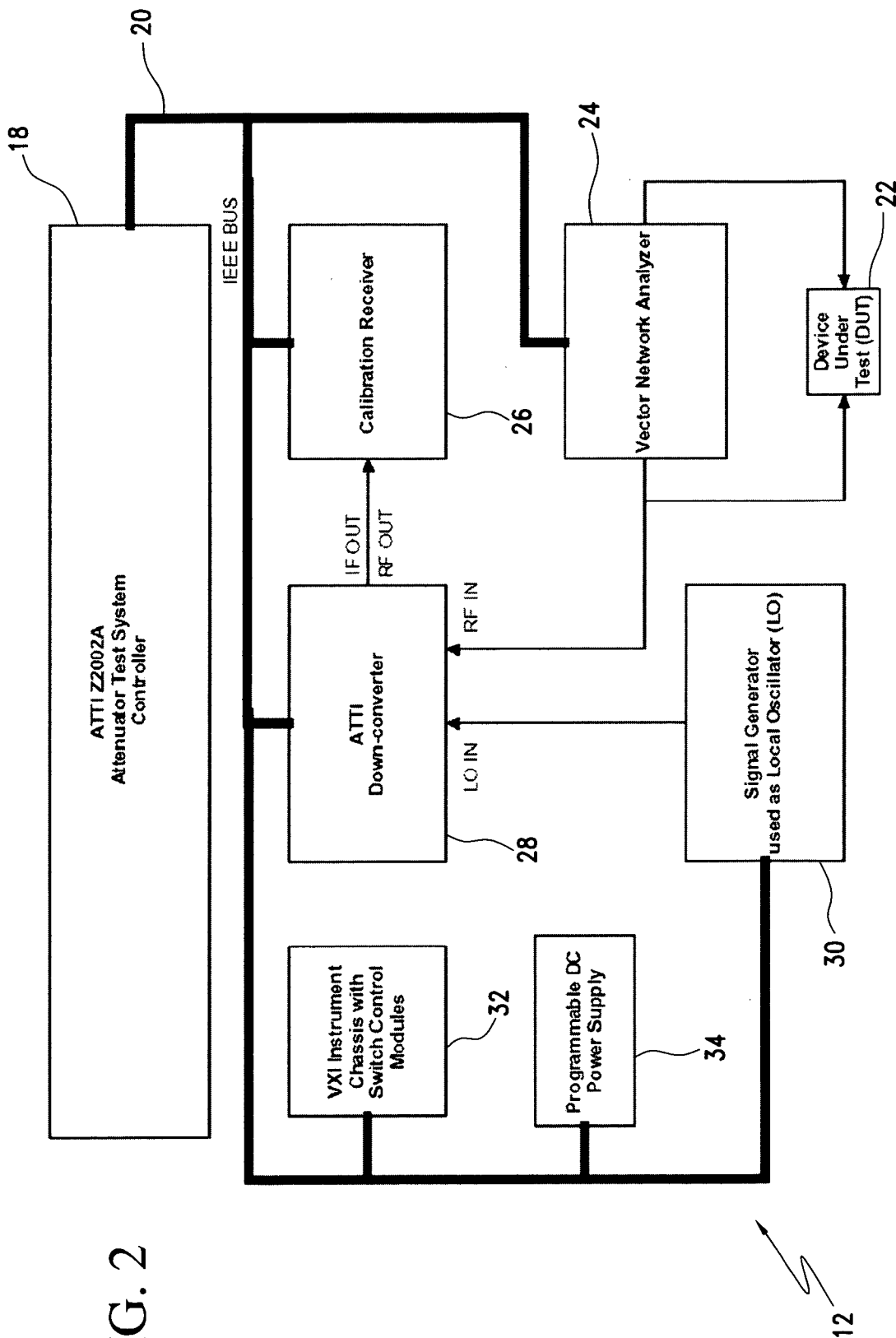
FIG. 2 is a block diagram of the hardware in the attenuator test system in accordance with the invention.

Referring now to FIG. 2, a block diagram of the hardware 12 of the attenuator test system is shown. The system 10 is controlled by a control unit or controller 18, such as a PC-type computer, utilizing IEEE bus 20 communicating with each of the hardware instruments and components. The software 14, described below, is embodied in the controller 18. All measurements on a device under test (DUT) 22 are performed using either a vector network analyzer (VNA) 24 or a calibration receiver 26. The VNA 24 is coupled to the DUT 22 and via the bus 20 to the controller 18. The calibration receiver 26 is coupled to the controller 18 via the bus 20 and to the DUT 22 via a down-converter 28. Down-converter 28 is coupled to the controller 18 via the bus 20 and preferably is a microwave down-converter sold by the current assignee.

The DUT 22 has two ports, Port 1 and Port 2. The VNA 24 is coupled to both ports. Instead of a VNA 24 and/or calibration receiver 26, it is conceivable that other instruments which perform identical or similar functions may also be used in the invention.

The VNA 24 preferably has a frequency range of about 50 MHz to about 40 GHz and a measurement dynamic range of about 70 dB minimum. The calibration receiver 26 is preferably a tuned receiver with a frequency range of about 100 kHz to about 3 GHz and a measurement dynamic range of 0 dB to about –140 dB. The frequency down-converter 28 is preferably a specialized instrument constructed by the current assignee which, in addition to the frequency conversion capability, include memory that allows for storage of path data swept over the entire operating frequency range of the system 10.

The determination of which instrument, i.e., the VNA 24 or the calibration receiver 26, performs a particular measurement is determined by the appropriate test software code based upon defined control parameters. The VNA 24 provides an input stimulus signal for the DUT 22 (from Port 1) regardless of which instrument is performing the measurement. An output signal from the DUT 22 is then measured using either a receiver section of the VNA 24 (via Port 2) or the calibration receiver 26 through the down-converter 28. In the latter situation, the down-converter 28 will modify the output signal from the DUT 22 and provides a modified signal (represented by "IF OUT/RF OUT" in FIG. 2) to the calibration receiver 26 when the output signal is greater than the capability of the calibration receiver 26, e.g., greater than 1 GHz. Otherwise, the down-converter 28 does not change the frequency of the output signal from the DUT 22.

A signal generator 30 provides a local oscillator (LO) signal for the down-converter 28 and is dedicated strictly for that intended purpose and is never used as a stimulus for the DUT 22. Rather, the VNA 24 is used to provide an input stimulus signal for the DUT 22. This LO signal is represented by the input into the "LO IN" of the down-converter 28. The LO signal generator 30 is coupled to the controller 18 via the bus 20 and is selected based on low-noise characteristics in order to prevent contamination of the down-converted signal being measured.

A VXI instrument chassis 32 contains Switch Control Modules which are used in conjunction with a programmable DC power supply 34 to control settings for any programmable attenuators being tested. Both the VXI instrument chassis 32 and the programmable DC power supply 34 are coupled to the controller 18 via the bus 20. The signal generator 30, which acts as the local oscillator (LO) for the down-converter 28, preferably has a frequency range of about 250 kHz to about 40 GHz and is capable of supplying a signal at a level of 10 dBm.

All of the test instruments except for the specialized down-converter 28, i.e., the VNA 24, calibration receiver 26, signal generator 30, chassis 32 and power supply 34, can be categorized as standard COTS (Commercial Off The Shelf) test equipment. That is, any generic make and model meeting the minimum defined specifications (including software driver module) can be interchanged within the system configuration without affecting system performance. The system 10 in its entirety is controlled by a PC-type computer incorporating the controller 18 and running the software 14.

Referring now to FIGS. 3.1–3.4, the software 14 of the attenuator test system 10 in accordance with the invention will now be described. The top level of the software 14, shown in FIG. 3.1, breaks the system into three distinct components: data generation software 36, executive software 38 and third party software 40. In its simplest form, the data generation software 36 and third party software 40 work together defining and containing all the information or data that is specific to the test and system database. The executive software 38 uses the database information, but takes over the control of the automated test system 10 once a selected test has commenced execution.

A block diagram of the third party software 40 is shown in FIG. 3.4. Contained within this category of software are TrueDB Grid 42 and ReSize OCX 44. These are Commercial Off The Shelf (COTS) software packages that do not require further explanation as they are known and used by those skilled in the art.

Generally, the True DB Grid 42 enables the functions of managing the database interface, browsing, editing, adding and deleting data in a tabular (grid) format and customizing data presentation. The ReSize OCX 44 enables resizing of windows, fonts, scroll bars, data controls and grid controls.

These software packages 42, 44 provide the skeletal structure and flexible management of the database for the application. Using this foundation and working in conjunction with the data generation software 36, a database is defined, configured and managed.

A block diagram of the data generation software 36 is expanded in FIG. 3.3. The data generation block software 36 contains four sublevels, the first of which is account administration 46. Using passwords, three account levels are set in the account administration 46 as follows: Administrator, Developer and Technician. The Administrator is the highest level and has complete capability to define or modify any function of the database. The Developer level cannot modify the database design, but still has the capability of defining or changing parameters relating to attenuator tests, the attenuator database, the test sequence or hardware configuration, as well as maintaining proper hardware configuration. The Technician level has the least capability, being limited to test performance and diagnostics, e.g., DUT certification, as well as the capability of data logging and problem reporting.

The second sublevel of the data generation software 36 is a database management portion 48 which provides for creating and modifying test files associated with attenuators that are to be tested. These files contain all the specific information for testing the Device Under Test (DUT) 22. Thus, the database management portion 48 creates and modifies the attenuator database and edits DUT information. Test configuration comprises defining and editing constant, variable, and setup parameters for each test, whether SWR or flatness. Constant parameters include perform test, input power, and the number of averages per measurement (averaging). Variable test parameters include frequency values to test as well as test limits for each frequency. Setup parameters, if necessary include any instructions that need to be provided to the user in order to perform the test.

The third sublevel of the database management software 36 is a test management portion 50 which defines which tests are to be performed for a given execution (not all tests have to be performed each execution) and the order in which the selected tests will be performed. Technician level usage has the capability to determine which tests are to be performed and the order of performance.

The fourth and last sublevel of the database management software 36 is a hardware configuration portion 52 which performs the task of defining all of the instruments that are contained within the test system, including for example, their respective model number, serial number, HPIB status and address, and calibration information. If an instrument within the system is replaced with another instrument, this information is edited to reflect the change in system assets. This information relates to the test system instrumentation and thus is independent of the DUT 22.

A block diagram of the executive software 38 is expanded in FIG. 3.2. The executive software 38 functions to take control after the tests have been defined and prior to their execution. The executive software 38 first determines any calibration prerequisites that need to be performed and executes them accordingly. Once the calibration requirements have been satisfied, for example one-port calibration of the network analyzer 34 prior to starting an SWR test, the executive software 38 coordinates the test execution.

The executive software 38 contains four sublevels, the first of which is instrument drivers 54. The instrument drivers 54 provides for a dynamic link library (DLL) and a test system interface. The DLL may be written in C++ language as a stand-alone program. The test system interface bonds application software and test system hardware and allows for easy hardware substitution and replacement when desired or needed. Also, the test system interface communicates with instrumentation via NI-VISA.

The second sublevel of the executive software 38 is the calibration routines 56 which establish NIST traceability and maximize repeatability. To establish NIST traceability, a 50 dB precision pad is preferably used. For the network analyzer 24 (designated NWA in FIG. 3.2), a software routine for a 1 or 2 port calibration is provided. For the calibration receiver 26, a software routine is provided to zero the sensor and define the module range. For the down-converter 28, a software routine for a path loss data analysis is provided. In order to maximize repeatability of the testing, the calibration cycle is designed to be optimized and flexible. Switch repeatability errors are eliminated. Algorithms are also provided to minimize image responses.

The third sublevel of the executive software 38 is test sequencing 58 which controls execution of the test and includes debug modes. This software is designed to control execution of the test by following the user-selected sequence. An averaging routine removes random errors (noise). During the tests, the test sequencing software is designed to react to errors, for example, stop on a fail in the program, stop on an error in the program, stop only on failures or a single step type of debugging.

The fourth sublevel of the executive software 38 is test execution 60 which provides for resource control and data logging. With respect to resource control, the test execution software provides coordinator/communication of test system hardware with the DUT 22. When required, it invokes the calibration routines 56 automatically. The test execution software 60 is designed with the ability to execute a test program in simulation or, when test system resources are unavailable, in a degraded mode. The data logging functions includes printing or saving test results and error logging for bug reporting.

Referring now to FIGS. 4.1–4.4, an exemplifying, but non-limiting, use of the attenuator test system 10 in accordance with the invention to measure the flatness of an attenuator over a specified frequency range will be explained. An SWR measurement test is discussed below with reference to FIG. 5.

As shown in FIG. 4.1, the first task of the software of the attenuator test system 10 is a housekeeping function (step 100). This subroutine sorts through test file data in order to determine which measuring and testing instruments will be required based upon predetermined conditions. Upon completion of sorting the test data file, one of three possible cases will be determined to be true and testing will proceed along the determined path.

The first case is when all of the attenuator values being tested are less than or equal to 50 dB (102). In this case, the only instrument required for the flatness measurements is the network analyzer 24. The data that was generated by performance of the two-port calibration is recalled and used as reference for the measurements of the network analyzer 24 (104). The flowchart extension for this case is shown in FIG. 4.2. This is the most simple of the three possible testing cases.

As shown in FIG. 4.2, the DUT is connected to the network analyzer 24 (106) and the network analyzer 24 is controlled to perform a measurement (108). After each measurement, a determination is made whether the end of the file (EOF) is reached (110) and if not, the network analyzer 24 makes another measurement (108) and this loop continues until the end of the file at which point the testing is complete (112). When the testing is completed, the DUT is removed from the setup, i.e., disconnected from the network analyzer 24.

The second case is when all of the attenuator values being tested are greater than 50 dB (114). In this case, only the calibration receiver 26 (along with the frequency down-converter 28 if required) is necessary for making the flatness measurements. Prior to calibration, source measurements are made for use as a reference (116) Two measurements are performed by the calibration receiver 26 for testing flatness, one without the DUT 22 in the measurement setup including the calibration receiver 26 and the down-converter 28 and the other with the DUT 22 in the measurement setup. The flowchart extension for this case is shown in FIG. 4.3. Prior to connecting the attenuator to be tested, the source power is measured at each test frequency.

As shown in FIG. 4.3, to measure the source power at each test frequency, the source is connected to the calibration receiver 26 without the DUT being connected to the setup (118) and then for each frequency value, a determination is made as to whether it is less than or equal to 1 GHz or greater than 1 GHZ (120). When less than or equal to 1 GHz, the calibration receiver 26 measures the source power (baseband) (122) and after each measurement, a determination is made whether the end of the file (EOF) is reached (124) and if not, the following frequency value is again analyzed relative to the 1 GHz threshold (120). When the frequency value is greater than 1 GHz, the calibration receiver 26 measures the source power down-converted to the IF frequency by the down-converter 28 (126) and after each measurement, a determination is made whether the end of the file (EOF) is reached (128) and if not, the following frequency value is again analyzed relative to the 1 GHz threshold (120). When the end of the file is reached, the source power measurements are completed and the DUT is then connected to the test setup (130).

Once the DUT is connected to the test setup, for each frequency value, a determination is made as to whether it is less than or equal to 1 GHz or greater than 1 GHZ (132). When less than or equal to 1 GHz, the calibration receiver 26 measures the source power (baseband) (134) and after each measurement, a determination is made whether the end of the file (EOF) is reached (136) and if not, the following frequency value is again analyzed relative to the 1 GHz threshold (132). When the frequency value is greater than 1 GHz, the calibration receiver 26 measures the source power down-converted to the IF frequency by the down-converter 28 (138) and after each measurement, a determination is made whether the end of the file (EOF) is reached (140) and if not, the following frequency value is again analyzed relative to the 1 GHz threshold (132). When the end of the file is reached, the DUT is removed from the setup (142) and testing is complete (144).

The third case is when some of the attenuator values to be tested are less than 50 dB and some are greater than 50 dB, within the same test file, as is the case with a step attenuator that ranges from 0 dB to 80 dB in 10 dB steps (146). In this case, any values that are less than or equal to 50 dB are measured with the network analyzer 24 and any values that are greater than 50 dB are measured with the calibration receiver 26 (along with the down-converter 28 if required).

Prior to testing, the data that was generated by performance of the two-port calibration is recalled and used as reference for the measurements of the network analyzer 24 and also source measurements are made for use as a reference (148).

FIG. 4.4 shows the flowchart extension for this case. A determination is made whether the attenuator value is less than or equal to 50 db or greater than 50 dB (150) and when less than or equal to 50 dB, the flowchart shown in FIG. 4.2 is applied (106, 108, 110, 112) with the exception that if the end of the file is not reached, the loop returns to process the next attenuator value and analyzes it relate to the threshold of 50 dB (150). When the attenuator value is greater than 50 dB, the flowchart shown in FIG. 4.3 is applied (118, 120, 122, 124, 126, 128, 130, 132, 134, 136, 138, 140, 142, 144) with the exception that if the end of the file is not reached during the testing stage, the loop returns to process the next attenuator value and analyzes it relate to the threshold of 50 dB (150).

Figure 5:
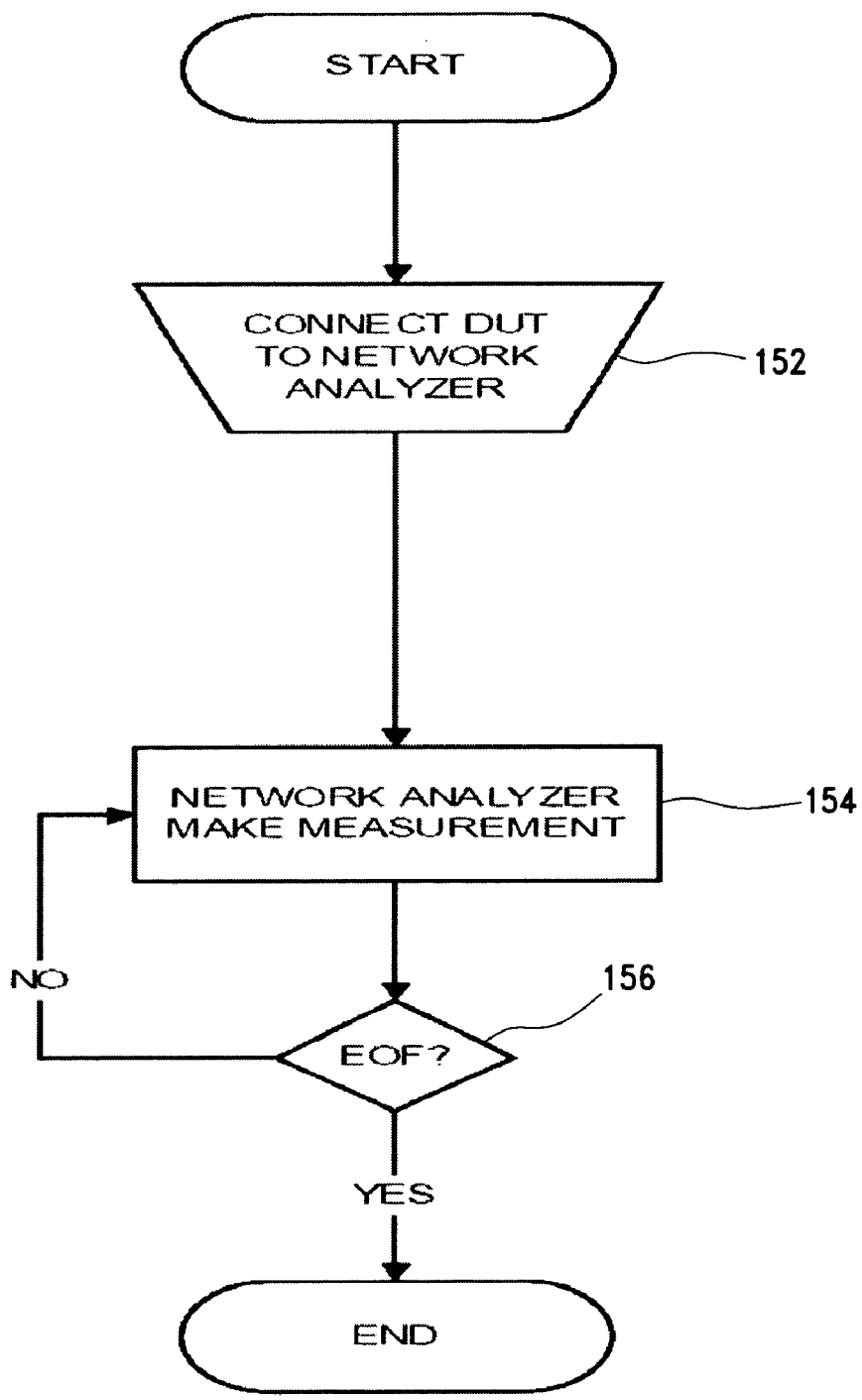
FIG. 5 is a flowchart of a SWR test using the attenuator test system in accordance with the invention.

With the hardware 12 and software 14 described above, a test 16 can be performed in the exemplifying, non-limiting manner shown in FIG. 5. The exemplifying test is a standing wave ration (SWR) test of an attenuator over a specified frequency range. At step 152, the device under test 22 is connected at the start of the process and each frequency will cause the measurement loop (step 154 performed by the network analyzer 24) to be performed until the end of file (EOF) is reached (loop 156).

With the configuration described above, the attenuator test system 10 in accordance with the invention provides a database-driven test system which tests a wide range of fixed and programmable attenuators over a non-limiting frequency range of 50 MHz to 40 GHz (with 40 GHz option). The system 10 provides the capability of both flatness and SWR testing. For flatness testing, the system 10 provides capability to measure dynamic range without introducing errors in linearity, thereby distorting measurement results. In one embodiment, the operating frequency range is from about 50 MHz to about 40 GHz and a measurement dynamic range of 120 dB (0 to −120 dB). For SWR testing, in which the amount of energy reflected by an attenuator is measured at its connection interface, the vector network analyzer 24 is designed to quickly and easily perform this test without the requirement of external test devices such as bridges.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. A system for testing attenuators, comprising:
    a vector network analyzer adapted to be coupled to a device under test (DUT), said network analyzer being arranged to provide an input stimulus signal for the DUT and being arranged to receive an output signal from the DUT;
    a down-converter having frequency conversion capability;
    a signal generator for providing a local oscillator (LO) signal for said down-converter;
    a calibration receiver adapted to be coupled to the DUT via said down-converter such that an output signal from the DUT is receivable by said down-converter, optionally modified thereby and sent to said calibration receiver; and
    a control unit coupled to said network analyzer and said calibration receiver and arranged to select which of said network analyzer and said calibration receiver measure the output signal from the DUT.

2. The system of claim 1, wherein said down-converter is a microwave down-converter.

3. The system of claim 1, wherein said down-converter includes a memory unit which stores path data containing correction factors to account for changes in contact resistance along switched paths to thereby minimize switch repeatability errors.

4. The system of claim 1, wherein said network analyzer has a frequency range of about 50 MHz to about 40 GHz and a measurement dynamic range of about 70 dB minimum and said calibration receiver is a tuned receiver with a frequency range of about 100 kHz to about 3 GHz and a measurement dynamic range of 0 dB to about −140 dB.

5. The system of claim 1, further comprising a VXI instrument chassis and a programmable DC power supply for controlling settings for programmable attenuators being tested.

6. The system of claim 1, wherein said signal generator has a frequency range of about 250 kHz to about 40 GHz and is capable of supplying a signal at a level of 10 dBm.

7. The system of claim 1, wherein said control unit embodies software for directing said network analyzer, said calibration receiver, said down-converter and said signal generator to perform a flatness test and a standing wave ratio test.

8. The system of claim 1, wherein said control unit embodies software arranged to generate and allow editing of databases relating to devices under test, tests being performed by the system and instrumentation of the system performing the tests including said network analyzer and said calibration receiver.

9. The system of claim 1, wherein said control unit is arranged to select which of said network analyzer and said calibration receiver measures the output signal from the DUT based on comparison of the output signal to a 50 dB reference.

10. A method for measuring flatness of an attenuator over a specified frequency range, comprising:
    forming a file of attenuator values to be used in the test;
    determining instruments to be used in the measurement based upon predetermined conditions relating to the attenuator values in the file, the instruments being selected from a vector network analyzer, a calibration receiver and a down-converter whereby when the attenuator values in the file are all less than or equal to 50 dB, only the network analyzer is used, when the attenuator values in the file are all above 50 dB, only the calibration receiver and the down-converter are used and when at least one of the attenuator values in the file is above 50 dB and at least one of the attenuator values in the file is less than or equal to 50 dB, the network analyzer, the calibration receiver and the down-converter are used; and
    sequentially testing each of the attenuator values by
        when the attenuator value being tested is less than or equal to 50 dB, connecting a device under test (DUT) to the network analyzer, directing an input stimulus signal from the network analyzer to the DUT and receiving and measuring output signals from the DUT at the network analyzer,
    when the attenuator value being tested are is greater than 50 dB, measuring the source power at each frequency, while down-converting the frequency when greater than 1 GHz, without the DUT being connected in a test setup with the calibration receiver and down-converter, and when the source power measurements are completed for the frequencies in the specified frequency range, connecting the DUT to the test setup and measuring the source power at each frequency value, while down-converting the frequency when greater than 1 GHz.

11. The method of claim 10, further comprising:
    performing a two-port calibration on the network analyzer prior to the sequential testing of the attenuator values when the attenuator values being tested are less than or equal to 50 dB;
    recalling data generated by the performance of the two-port calibration; and using the recalled data as a reference for the measurements of the output signals from the DUT at the network analyzer.

12. The method of claim 10, further comprising obtaining source measurements for use as a reference when the attenuator values being tested are greater than 50 dB.

13. A method for measuring standing wave ratio of an attenuator, comprising:
   forming a file of attenuator values to be used in the test;
   connecting a device under test (DUT) having two ports directly to a network analyzer such that the network analyzer is connected to both ports of the DUT and thereby obviating the use of a bridge to couple the DUT to the network analyzer; and
   sequentially testing each of the attenuator values by directing an input stimulus signal from the network analyzer to the DUT and receiving and measuring output signals from the DUT at the network analyzer.

14. A method for testing attenuators over a specified frequency range, comprising:
   coupling a vector network analyzer to a device under test (DUT);
   directing the network analyzer to provide an input stimulus signal for the DUT;
   when the attenuator value being tested is less than or equal to 50 dB,
   coupling an output port of the DUT to the network analyzer, and
   measuring the output signal by means of the network analyzer; and when the attenuator value being tested is greater than 50 dB,
   coupling a down-converter to an output port of the DUT,
   coupling a calibration receiver to the down-converter,
   measuring an output signal by means of the calibration receiver, and
   down-converting the output signal only when it exceeds the maximum frequency input of the calibration receiver.

15. The method of claim 14, further comprising coupling a signal generator to the down-converter to provide a local oscillator (LO) signal for the down-converter.

16. The method of claim 14, further comprising:
   coupling the network analyzer, the calibration receiver and the down-converter to a controller; and
   selecting which of the network analyzer and the calibration receiver is coupled to the output port of the DUT based on the attenuation being tested.

17. The method of claim 16, wherein the controller embodies software for directing the network analyzer, the calibration receiver and the down-converter to perform a flatness test and a standing wave ratio test.

18. The method of claim 16, wherein the controller embodies software arranged to generate and allow editing of databases relating to devices under test, tests being performed by the system and instrumentation of the system performing the tests including the network analyzer and the calibration receiver.

19. The method of claim 14, wherein the down-converter is a microwave down-converter including a memory unit which stores path data containing correction factors to account for changes in contact resistance along switched paths to thereby minimize switch repeatability errors.

* * * * *

UNITED STATES PATENT AND TRADEMARK OFFICE
CERTIFICATE OF CORRECTION

| | |
|---|---|
| PATENT NO. | : 7,065,466 B2 |
| APPLICATION NO. | : 10/767038 |
| DATED | : June 20, 2006 |
| INVENTOR(S) | : Jeffrey R. Clarke et al. |

Page 1 of 1

It is certified that error appears in the above-identified patent and that said Letters Patent is hereby corrected as shown below:

Col. 10, line 50, after "tested", delete "are".

Signed and Sealed this

Twenty-second Day of August, 2006

JON W. DUDAS
*Director of the United States Patent and Trademark Office*